United States Patent
Gaillard et al.

(10) Patent No.: US 6,285,220 B1
(45) Date of Patent: Sep. 4, 2001

(54) SAMPLE-AND-HOLD DEVICE

(75) Inventors: Christophe Gaillard, Saint Pancrasse; Stéphane Le Tual, Veurey Voroize, both of (FR)

(73) Assignee: Atmel Grenoble S.A., Saint Egreve (FR)

( * ) Notice: Subject to any disclaimer, the term of this patent is extended or adjusted under 35 U.S.C. 154(b) by 0 days.

(21) Appl. No.: 09/633,421

(22) Filed: Aug. 4, 2000

(30) Foreign Application Priority Data

Aug. 6, 1999 (FR) .................................................. 99 10282

(51) Int. Cl.[7] ................................................... G11C 27/02
(52) U.S. Cl. ................................................ 327/94; 327/95
(58) Field of Search .................................. 327/91, 94, 95, 327/344, 345, 363

(56) References Cited

U.S. PATENT DOCUMENTS

| | | | |
|---|---|---|---|
| 4,866,301 | * 9/1989 | Smith | 327/91 |
| 5,457,418 | 10/1995 | Chang | 327/91 |
| 5,471,210 | 11/1995 | Wingender et al. | 341/156 |
| 6,031,398 | * 2/2000 | Karanicolas | 327/94 |

FOREIGN PATENT DOCUMENTS 60-160099  8/1985 (JP) .
9-091988   4/1997 (JP) .

* cited by examiner

*Primary Examiner*—Toan Tran
(74) *Attorney, Agent, or Firm*—Oblon, Spivak, McClelland, Maier & Neustadt, P.C.

(57) ABSTRACT

A sample-and-hold device comprises a sampling transistor ($Q_{ech}$) and a sampling capacitor ($C_{ech}$), the sampling transistor being off in hold mode in order to prevent the discharging of the sampling capacitor and conductive in sampling mode to apply a voltage to the capacitor that is substantially equal to the voltage ($V_{ech}$) at its base. In order to apply a cut-off voltage to this base, in off mode, that is equal to the voltage present at the sampling capacitor, there is provided a circuit comprising, in series, between two power supply terminals, two MOS type transistors (MP1, MP2) having drain-source channels substantially with the same width-to-length ratio, a bipolar transistor (Qcl) having its base connected to the junction point of the two MOS transistors and its emitter connected to the base of the sampling transistor ($Q_{ech}$), and a diode (D1) biased by a current (Ip), connected between the source and the gate of one of the two MOS transistors (MP1), the gate of the other transistor (MP2) being connected to the sampling capacitor. This device can be applied especially to samplers used upline to an analog-digital converter.

7 Claims, 1 Drawing Sheet

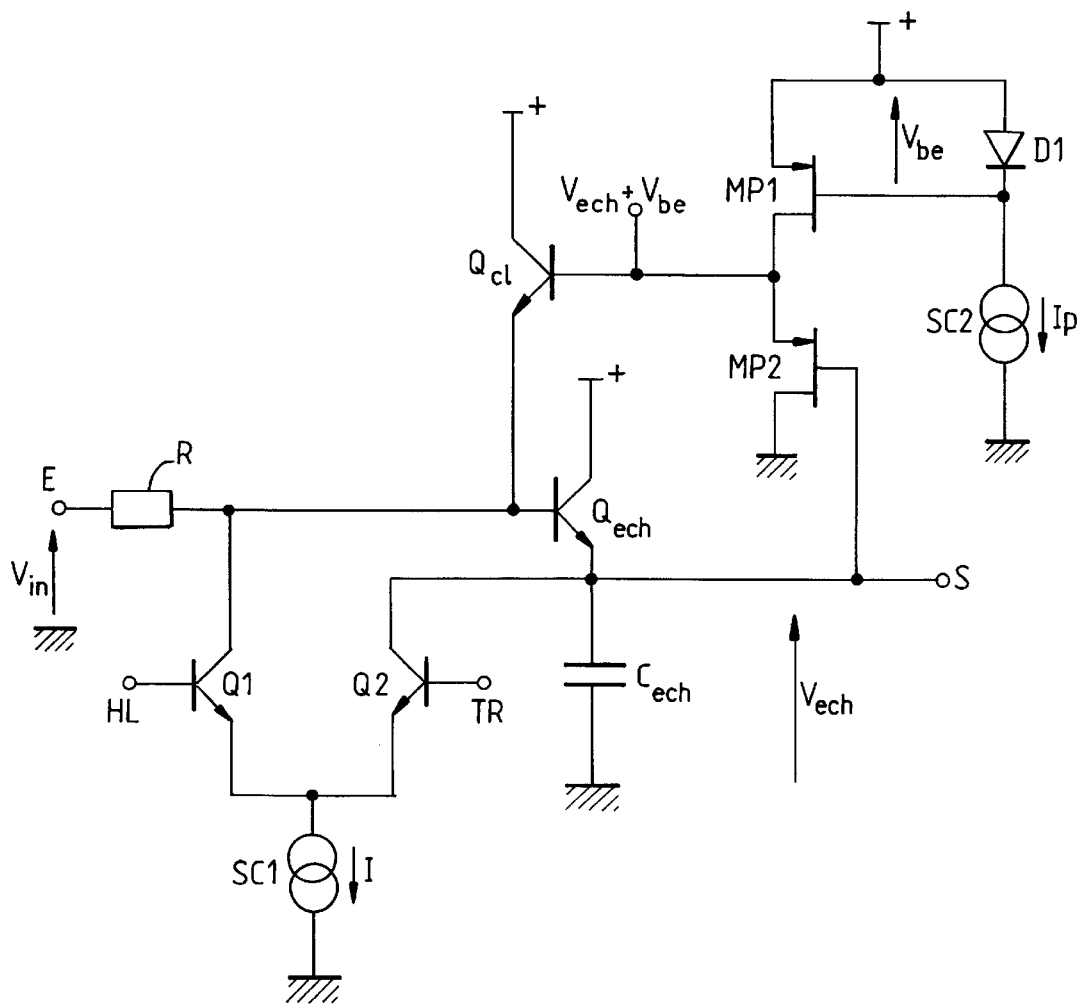

SAMPLE-AND-HOLD DEVICE

BACKGROUND OF THE INVENTION

The invention relates to a sample-and-hold device. It can be applied especially to sample-and-hold devices used upline to an analog-digital converter.

Acquisition systems are generally constituted by an analog chain, an analog-digital conversion and a digital processing chain. The present development of technology is tending to shift the boundary line between digital techniques and analog techniques further upline to the acquisition chain so as to achieve the maximum reduction of the analog part. This trend is aimed especially at simplifying the hardware architecture of systems by carrying out most of the functions, for example the filtering or modulation functions, with digital techniques while at the same time also reducing manufacturing costs.

A major consequence of this development is the great increase in the number of constraints transferred to the analog-digital conversion part since the converter is then at the head, or almost at the head, of the acquisition chain. These constraints can be illustrated by considering the case of a microwave receiver. In this case, the conventional structures have frequency transposition functions. In other words, the received signal undergoes one or more frequency changes before being digitally encoded and demodulated, the encoding and demodulating being then done at low frequency. The systems of the new generation must enable direct encoding of the received signal, namely analog-digital conversion, after only one first frequency change or even directly on the carrier. The analog-digital conversion then has to be done on high frequency or very high frequency signals. It may be noted, by way of an example, that the requirements for these systems, as regards analog-digital converters, are 10 to 14 bits for resolution and linearity, 70 MHz to 900 MHz for input frequencies and one million samples per second to some billions of samples per second for the conversion frequencies.

A key feature of these systems therefore is the analog-digital converter itself. Its performance especially is determined greatly by the quality of sampling which it has at the head of its structure, namely as a function of the sample-and-hold operation.

The function of a sample-and-hold device especially is to receive an analog signal at input that can vary continuously and give a signal known as a sampled signal at output, this being a signal that varies practically by steps. The level of a step is the level possessed by the input signal at the start of the corresponding sampling period, this level being updated at each new sampling period.

A sample-and-hold device works in two phases at each sampling period. During a short phase known as a sampling phase, the output voltage follows the progress of the input voltage. During a holding phase, the output voltage is held at the value that it had before the end of the sampling phase, in spite of the variations in the input voltage.

The qualities expected of a sample-and-hold device include especially the precision with which the input voltage is followed during the sampling phase as well as the holding quality during the holding phase. The output voltage has to faithfully reproduce the variations of the input voltage. With regard to the holding, the output voltage should not vary from the time when the holding phase has begun. Especially, it is desirable to minimize the influence of the parasitic capacitances which tend to cause variations in the output voltage when the input voltage undergoes fast variations.

Another quality expected of the sample-and-hold device is its ability to work at high frequency, especially so that it can sample the signals having a wide frequency spectrum. These qualities are particularly important to make it possible to meet the conversion requirements as cited here above. Another required quality is the ability to work at low power supply voltage, for example 5 volts or 3.3 volts or even less. Indeed, for reasons of energy saving, present-day circuits tend to work at increasingly low voltages.

It is an aim of the invention to provide for the making of a sample-and-hold device that has the best possible qualities with regard to the above criteria and, at the same time, has the simplest possible design and structure in order to minimize space requirement and therefore the cost of the circuit.

SUMMARY OF THE INVENTION

To this end, an object of the invention is a sample-and-hold device comprising a sampling transistor and a sampling capacitor, the sampling transistor being off in hold mode in order to prevent the discharging of the sampling capacitor and conductive in sampling mode to apply a voltage to the capacitor that is substantially equal to the voltage at its base wherein, in order to apply a cut-off voltage to said base, in off mode, that is equal to the voltage present at the sampling capacitor, there is provided a circuit comprising, in series, between two power supply terminals, two MOS type transistors having drain-source channels substantially with the same width-to-length ratio, a bipolar transistor having its base connected to the junction point of the two MOS transistors and its emitter connected to the base of the sampling transistor, a diode biased by a constant current, connected between the source and the gate of one of the two MOS transistors, the gate of the other transistor being connected to the sampling capacitor.

BRIEF DESCRIPTION OF THE DRAWING

Other characteristics and advantages of the invention shall appear from the following detailed description made with reference to the appended drawing in which the single FIGURE gives a view, in a diagrammatic drawing, of an exemplary embodiment of a sample-and-hold device according to the invention.

MORE DETAILED DESCRIPTION

The sample-and-hold device comprises an input E and a sampling capacitor $C_{ech}$ at whose terminals the voltage level Vin present on the input E is held up till the next sampling instant.

A sampling transistor $Q_{ech}$ that is conductive during the sampling phase and off during the holding phase has its emitter connected to a terminal of the sampling capacitor $C_{ech}$, its base being for example connected to the input E through a resistor R. The collector of the transistor $Q_{ech}$ is connected to a positive power supply. The other terminal of the capacitor $Q_{ech}$ is connected for example to a ground potential of the circuit. When the transistor $Q_{ech}$ is conductive, it applies the voltage present at its base to its emitter with a voltage shift equal to an emitter-base voltage $V_{be}$ that varies conventionally from 0.6 to 0.7 volts. This transistor is therefore mounted as a follower transistor. The output S of the sample-and-hold device is taken at the junction of the sampling capacitor $C_{ech}$ and the sampling emitter $Q_{ech}$.

An input circuit is used to hold and make the sampling transistor $Q_{ech}$ conductive. This circuit has, for example, a pair of transistors Q1, Q2 whose emitters are connected to a current source SC1. The collector of a first transistor Q1 is connected to the base of the sampling transistor $Q_{ech}$ and the collector of the second transistor Q2 is connected to the emitter of the sampling transistor $Q_{ech}$ as well as to the sampling capacitor $C_{ech}$. The first transistor Q1 has its base controlled by a signal HL that is active during the holding phase. It is therefore conductive during this phase. It then draws the base potential of the sampling transistor downwards in order to cut it off. The second transistor Q2 has its base controlled by a signal TR that is active during the sampling phase. It is therefore conductive during this phase. It then enables the emitter of the sampling transistor to be supplied with current by the source SC1 so that this transistor works as a follower during the sampling phase. The signals TR and HL are complementary, namely one is at the high level when the other is at the low level and vice versa.

The sample-and-hold device has a follower circuit at output of the emitter of the sampling transistor $Q_{ech}$ which is looped to the base of this transistor. The function of this circuit especially is to see to it that the voltage applied to the base of the sampling transistor $Q_{ech}$ in off mode is equal to the voltage present at the emitter of this transistor $Q_{ech}$, namely the output voltage S present at the sampling capacitor $C_{ech}$. This ensures especially that this transistor is cut off and, at the same time, reduces the extent to which the variations in the input voltage are transmitted, by capacitive influence, towards the voltage present in the sampling capacitor $C_{ech}$. This transmission is essentially due to the junction capacitance between the base and the emitter of the sampling transistor $Q_{ech}$.

The follower circuit comprises the following in series between two positive power supply terminals: two MOS type transistors MP1, MP2, a bipolar transistor Qcl and a diode D1 biased by current Ip, for example a constant current.

The bipolar transistor Qcl has its base connected to the junction point of the two MOS type transistors MP1, MP2 and its emitter connected to the base of the sampling transistor $Q_{ech}$. The collector of the bipolar transistor Qcl is for example connected to a positive power supply terminal. The diode is connected between the source and the gate of one of the two transistors MP1, the gate of the second transistor MP2 being connected to the sampling capacitor $C_{ech}$. The bias current Ip is given for example to the diode D1 by a current source SC2 connected to the cathode of the diode D1 and a power supply terminal, for example the ground potential.

$V_{ech}$ is the sampling voltage at the terminals of the sampling capacitor $C_{ech}$. According to the invention, the follower circuit, through an intelligent choice of the MOS type transistors MP1, MP2, makes the potential present at the base of the bipolar transistor Qcl have the value $V_{ech}$+Vbe where Vbe is the base-emitter potential of this transistor Qcl but also of the sampling transistor $Q_{ech}$ It can be assumed especially that the two transistors have the same base-emitter voltage since it comes from their PN junctions whose voltage is perfectly defined as a function of temperature. By construction, the two transistors Qcl and $Q_{ech}$ are very close and therefore have the same junction temperatures and therefore the same base-emitter voltages Vbe.

Since the voltage present at the base of the bipolar transistor Qcl is equal to $V_{ech}$+Vbe, the result thereof is that the voltage present at its emitter, which is equal to its basic voltage minus its base-emitter voltage, is equal to ($V_{ech}$+Vbe)−Vbe=$V_{ech}$, namely equal to the sampling voltage.

Since the diode D1 is crossed by its bias voltage Ip, it has a junction voltage at its terminals that is equal to the base-emitter voltage Vbe of the two transistors Qcl and $Q_{ech}$ for the same reasons as those that make the base-emitter voltages of these two transistors the same. Since the two transistors MP1, MP2 are, for example, PMOS transistors, the anode of the diode D1 is connected to the source of the first transistor MP1 and its cathode is connected to the gate of this transistor MP1. The result of this is that the voltage between the source and the gate of the first transistor is equal to the junction voltage of the diode Vbe or base-emitter voltage of the transistors Qcl and $Q_{ech}$. The source of the first MOS transistor MP1 is connected for example to a positive power supply terminal and the drain of the second MOS transistor MP2 is connected for example to a second power supply terminal, at lower potential, for example the ground potential.

Furthermore, the drain current Id going through the two transistors meets the following relationships:

$$Id=\mu \cos [(W_1/L_1)(Vgs_1-Vs)^2] \quad (1)$$

and $$Id=\mu \cos [(W_2/L_2)(Vgs_2-Vs)^2] \quad (2)$$

where:

$\mu$ is a constant proper to the MOS type transistors;

$W_1$ and $W_2$ are respectively the widths of the channel between the drain and source of the first and second MOS transistors;

$L_1$ and $L_2$ are respectively the lengths of the channel between the drain and the source of the first and second MOS transistors;

$Vgs_1$ and $Vgs_2$ are respectively the voltages between the gate and the source of the first and second MOS transistors.

Vs is a threshold voltage proper to a MOS transistor.

By choosing the transistors MP1, MP2 such that their channel width-to-length ratios are equal, namely $(W_1/L_1)=(W_2/L_2)$, it follows that the relationships (1) and (2) dictate an equality of the gate-source voltages giving $Vgs_1=Vgs_2$ since the drain current is the same in each transistor.

In practice, to obtain transistors with drain-source channels having substantially the same length-to-width ratio, it is enough to select well-matched transistors. Matching measurements can be done by known electrical tests.

Given that the gate-source voltage $Vgs_1$ of the first transistor MP1 is equal to the voltage Vbe, it follows that the gate-source voltage $Vgs_2$ of the second transistor MP2 is also equal to this voltage Vbe. Now this gate-source voltage $Vgs_2$ is also the voltage between the emitter of the sampling transistor $Q_{ech}$ and the base of the bipolar transistor Qcl, so that the voltage present at this base is equal to the sampling voltage plus the base-emitter transistor $V_{ech}$+Vbe.

The voltage shift −Vbe of the bipolar transistor Qcl compensates for the voltage shift Vbe introduced by the two MOS transistors associated with the diode D1, in such a way that the base of the sampling transistor remains at the potential $V_{ech}$ of the output S. This is true only if the bipolar transistor Qcl is conductive and this transistor Qcl is conductive only in hold mode because of the first transistor Q1 of the input circuit which enables the discharging of its current.

It is not necessary for the bias voltage Ip of the diode D1 to be precise. It is enough for the voltages Vbe of the transistors Qcl, $Q_{ech}$ and the diode D1 to be substantially identical in the course of time, especially during temperature drifts in their environment. The current source SC2 can therefore be made simply and at low cost. In particular, it can be formed either by an NPN type bipolar transistor or by an NMOS type transistor or again by a simple resistor depending on the elements available in the technology considered.

The input circuit, consisting of a resistor R and a pair of transistors Q1, Q2 as shown in the figure, is herein given in its simplest version. It is of course possible to plan for other types of input circuits.

What is claimed is:

1. A sample-and-hold device comprising a sampling transistor and a sampling capacitor, the sampling transistor being off in hold mode in order to prevent the discharging of the sampling capacitor and conductive in sampling mode to apply a voltage to the capacitor that is substantially equal to the voltage at its base wherein, in order to apply a cut-off voltage to said base, in off mode, that is equal to the voltage present at the sampling capacitor, there is provided a circuit comprising, in series, between two power supply terminals, two MOS type transistors having drain-source channels substantially with the same width-to-length ratio, a bipolar transistor having its base connected to the junction point of the two MOS transistors and its emitter connected to the base of the sampling transistor, a diode biased by a constant current, connected between the source and the gate of one of the two MOS transistors, the gate of the other transistor being connected to the sampling capacitor.

2. A sample-and-hold device according to claim 1, wherein the two MOS type transistors being PMOS transistors, the source and the gate of a first transistor are respectively connected to the anode and the cathode of the diode, the gate and the drain of the second transistor being respectively connected to the sampling capacitor and to a power supply terminal at a potential lower than the power supply potential to which the source of the first transistor is connected.

3. A sample-and-hold device according to claim 1, wherein the bias current of the diode is given by a current source connected between the cathode of the diode and a power supply terminal.

4. A sample-and-hold device according to claim 3, wherein the power supply source is formed by an NPN type bipolar transistor.

5. A sample-and-hold device according to claim 3, wherein the power supply source is formed by an NMOS type transistor.

6. A sample-and-hold device according to claim 3, wherein the power supply source is formed by a resistor.

7. A sample-and-hold device according to claim 1, comprising a pair of transistors whose emitters are connected to a current source, the collector of a first transistor being connected to the base of the sampling transistor and the collector of the second transistor being connected to the emitter of the sampling transistor, the first transistor having its base controlled by a signal that is active during the holding phase, the second transistor having its base controlled by a signal that is active during the sampling phase, these signals being complementary.

* * * * *